United States Patent
Kim et al.

(10) Patent No.: US 9,748,321 B2
(45) Date of Patent: Aug. 29, 2017

(54) ORGANIC LIGHT-EMITTING DIODE DISPLAY

(71) Applicant: Samsung Display Co., Ltd., Yongin-si, Gyeonggi-do (KR)

(72) Inventors: Dongsoo Kim, Yongin-si (KR); Jinwoo Park, Yongin-si (KR); Changsoo Pyon, Yongin-si (KR); Junwon Choi, Yongin-si (KR); Juhee Hyeon, Yongin-si (KR); Wonkyu Kwak, Yongin-si (KR); Kimyeong Eom, Yongin-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/190,101

(22) Filed: Jun. 22, 2016

(65) Prior Publication Data

US 2017/0033171 A1 Feb. 2, 2017

(30) Foreign Application Priority Data

Jul. 28, 2015 (KR) .................. 10-2015-0106770

(51) Int. Cl.
*H01L 27/12* (2006.01)
*H01L 27/32* (2006.01)
*G09G 3/3233* (2016.01)

(52) U.S. Cl.
CPC ....... *H01L 27/3262* (2013.01); *G09G 3/3233* (2013.01); *H01L 27/3272* (2013.01);
(Continued)

(58) Field of Classification Search
None
See application file for complete search history.

(56) References Cited

U.S. PATENT DOCUMENTS 8,461,582 B2 * 6/2013 Kimura ............... H01L 27/1214
257/347
9,012,918 B2 * 4/2015 Yamazaki ........... H01L 27/1225
257/53

(Continued)

FOREIGN PATENT DOCUMENTS

KR 10-2009-0041312 A 4/2009
KR 10-2011-0052948 A 5/2011
(Continued)

*Primary Examiner* — Michael Lebentritt
(74) *Attorney, Agent, or Firm* — Knobbe, Martens, Olson & Bear, LLP

(57) ABSTRACT

An organic light-emitting diode display is disclosed. In one aspect, the display includes a substrate that includes a first sub-pixel region and a second sub-pixel region adjacent to the first sub-pixel region, and a first driving circuit and a second driving circuit respectively disposed in the first sub-pixel region and the second sub-pixel region. The first and second driving circuits include a first thin film transistor (TFT) and a second TFT. The display further includes a first pixel electrode and a second pixel electrode electrically connected to the first driving circuit and the second driving circuit, respectively, and a common electrode facing the first and second pixel electrodes. A first organic emission layer is interposed between the first pixel electrode and the common electrode, and a second organic emission layer interposed between the second pixel electrode and the common electrode, and a light-shielding member is configured to shield incident light.

20 Claims, 10 Drawing Sheets

(52) U.S. Cl.
CPC ............... *G09G 2300/0426* (2013.01); *G09G 2300/0819* (2013.01); *G09G 2300/0842* (2013.01); *G09G 2300/0852* (2013.01); *G09G 2300/0861* (2013.01); *G09G 2310/0262* (2013.01)

(56) References Cited

U.S. PATENT DOCUMENTS

| | | | |
|---|---|---|---|
| 9,046,955 B1* | 6/2015 | Lee | G06F 3/0412 |
| 9,224,762 B1* | 12/2015 | Li | H01L 27/1214 |
| 2005/0017934 A1 | 1/2005 | Chung et al. | |
| 2008/0297676 A1* | 12/2008 | Kimura | G02F 1/13624 |
| | | | 349/39 |
| 2009/0091254 A1 | 4/2009 | Jeong et al. | |
| 2010/0096638 A1* | 4/2010 | Choo | H01L 27/124 |
| | | | 257/72 |
| 2011/0114957 A1 | 5/2011 | Kim et al. | |
| 2012/0168756 A1 | 7/2012 | Ryu et al. | |
| 2015/0001542 A1* | 1/2015 | Jang | H01L 27/1225 |
| | | | 257/67 |
| 2015/0108465 A1* | 4/2015 | Koyama | H01L 27/3258 |
| | | | 257/40 |
| 2015/0144904 A1* | 5/2015 | Jeong | H01L 27/326 |
| | | | 257/40 |
| 2015/0287768 A1* | 10/2015 | Sato | G02F 1/1323 |
| | | | 315/152 |
| 2016/0141425 A1* | 5/2016 | Sun | H01L 27/124 |
| | | | 257/72 |
| 2016/0246111 A1* | 8/2016 | Chen | H04N 9/12 |
| 2016/0300859 A1* | 10/2016 | Moon | H01L 27/1225 |
| 2016/0327845 A1* | 11/2016 | Kim | G02F 1/136286 |
| 2016/0349565 A1* | 12/2016 | Kim | G02F 1/13452 |
| 2016/0357042 A1* | 12/2016 | Yoon | G02F 1/1339 |
| 2016/0377928 A1* | 12/2016 | Park | G02F 1/133512 |
| | | | 349/46 |
| 2017/0016930 A1* | 1/2017 | Qiu | G01P 15/0802 |
| 2017/0053973 A1* | 2/2017 | Park | H01L 27/3246 |
| 2017/0092658 A1* | 3/2017 | Sun | H01L 27/124 |

FOREIGN PATENT DOCUMENTS

| | | |
|---|---|---|
| KR | 10-2012-0078293 A | 7/2012 |
| KR | 10-2014-0069896 A | 6/2014 |

* cited by examiner

ORGANIC LIGHT-EMITTING DIODE DISPLAY

CROSS-REFERENCE TO RELATED APPLICATION

This application claims the benefit of Korean Patent Application No. 10-2015-0106770, filed on Jul. 28, 2015, in the Korean Intellectual Property Office, the disclosure of which is incorporated herein in its entirety by reference.

BACKGROUND

Field

The described technology generally relates to an organic light-emitting diode display.

Description of the Related Technology

Display devices such as an organic light-emitting diode (OLED) display and a liquid crystal display (LCD) device include a thin film transistor (TFT) array substrate including finely patterns structures such as a TFT, a capacitor, and a plurality of wirings. The display device operates via various interactions between these elements.

Since the OLED display is self-luminous, it may be driven by low voltage and configured in a lightweight and slim profile. OLED technology has additional favorable characteristics such as wide viewing angles, high contrast, fast response rates, etc. OLED displays are used across a spectrum of consumer electronics from personal portable apparatuses such as an MP3 player or a mobile phone up to a television (TV).

As market demand increases for a compact OLED display of high resolution, efficient space disposition, the connection structure between a TFT, a capacitor, and wirings included in the OLED display, a driving method, and quality images are required.

SUMMARY OF CERTAIN INVENTIVE ASPECTS

One inventive aspect relates to an OLED display.

Another aspect is an OLED display that includes: a substrate including a first sub-pixel region and a second sub-pixel region adjacent to the first sub-pixel region; a first driving circuit and a second driving circuit respectively disposed in the first sub-pixel region and the second sub-pixel region on the substrate; a first thin film transistor including a first active pattern comprising a first source region, a first channel region, and a first drain region, and a first gate electrode insulated from the first active pattern, included in the first driving circuit; a second thin film transistor including a second active pattern comprising a second source region, a second channel region, and a second drain region, and a second gate electrode insulated from the second active pattern, included in the second driving circuit; a first pixel electrode and a second pixel electrode electrically connected with the first driving circuit and the second driving circuit, respectively; a common electrode facing the first pixel electrode and the second pixel electrode; a first organic emission layer disposed between the first pixel electrode and the common electrode, and a second organic emission layer disposed between the second pixel electrode and the common electrode; and a light-shielding member shielding incident light, disposed on the second thin film transistor disposed in the second sub-pixel region, and at least a portion of the first pixel electrode overlaps at least one of the first source region and the first drain region in a plan view, and at least a portion of the light-shielding member overlaps at least one of the second source region and the second drain region in a plan view.

The light-shielding member may be disposed in a layer in which the second pixel electrode is disposed, and spaced apart from the second pixel electrode.

The light-shielding member may be extended from a portion of a different pixel electrode adjacent to the second sub-pixel region.

The second driving circuit may include: a semiconductor layer including the first active pattern and the second active pattern; a first conductive layer including the first gate electrode and the second gate electrode, disposed on the semiconductor layer; a second conductive layer disposed on the first conductive layer; and a third conductive layer disposed on the second conductive layer, and a first insulating layer, a second insulating layer, and a third insulating layer may be respectively disposed between the semiconductor layer and the first conductive layer, between the first conductive layer and the second conductive layer, and between the second conductive layer and the third conductive layer.

The first driving circuit may include a first driving thin film transistor and a first capacitor, and the second driving circuit may include a second driving thin film transistor and a second capacitor.

The first thin film transistor and the second thin film transistor may diode-connect the first driving thin film transistor and the second driving thin film transistor, respectively.

The first driving thin film transistor may include a first driving active pattern included in the semiconductor layer and a first driving gate electrode included in the first conductive layer, and a first upper electrode overlapping the first driving gate electrode in a plan view, included in the second conductive layer, and disposed on the first driving gate electrode, and the second driving thin film transistor may include a second driving active pattern included in the semiconductor layer and a second driving gate electrode included in the first conductive layer, and a second upper electrode overlapping the second driving gate electrode in a plan view, included in the second conductive layer, and disposed on the second driving gate electrode.

The light-shielding member may be disposed in a layer in which the second upper electrode is disposed, and spaced apart from the second upper electrode.

The light-shielding member may be extended from a portion of the second upper electrode.

The second driving active pattern may include a second driving source region and a second driving drain region, the second driving thin film transistor may include a second driving source electrode connected with the second driving source region and a second driving drain electrode connected with the second driving drain region, and the light-shielding member may be disposed in a layer in which the second driving source electrode and the second driving drain electrode are disposed.

The third conductive layer may include a connection member that connects the second driving gate electrode with the second drain region, and the light-shielding member may be extended from a portion of the connection member.

The third conductive layer may include data lines that transfer data signals to the first driving circuit and the second driving circuit, respectively.

The light-shielding member may be disposed in a layer in which the data lines are disposed, and spaced apart from the data lines.

The substrate may further include a third sub-pixel region adjacent to the second sub-pixel region, and the first sub-pixel region, the second sub-pixel region, and the third sub-pixel region may correspond to a red sub-pixel region, a green sub-pixel region, and a blue sub-pixel region, respectively.

The substrate may further include: a third sub-pixel region adjacent to the second sub-pixel region; a third driving circuit disposed in the third sub-pixel region on the substrate; and a third pixel electrode electrically connected with the third driving circuit, and the second pixel electrode may be disposed on a first row, the first pixel electrode and the third pixel electrode may be disposed on a second row adjacent to the first row, and the second pixel electrode and the first pixel electrode may be alternately disposed and the second pixel electrode and the third pixel electrode may be alternately disposed.

Each of the first source region, the first drain region, the second source region, and the second drain region may include Si.

The OLED display may further include: a first common layer disposed between the first pixel electrode and the second pixel electrode, and the first organic emission layer and the second organic emission layer; and a second common layer disposed between the first organic emission layer and the second organic emission layer, and the common electrode, and the first common layer may include at least one of a hole injection layer and a hole transport layer, and the second common layer may include at least one of an electron transport layer and an electron injection layer.

The light-shielding member may include a metallic layer.

The light-shielding member may include at least one of Ag, Mg, Al, Pt, Pd, Au, Ni, Nd, Ir, and Cr.

The second organic emission layer emits green light.

Another aspect is an organic light-emitting diode (OLED) display, comprising: a substrate comprising a first sub-pixel region and a second sub-pixel region adjacent to the first sub-pixel region; and a first driving circuit and a second driving circuit respectively disposed in the first sub-pixel region and the second sub-pixel region. The display also includes a first driving circuit disposed in the first sub-pixel region and comprising a first thin film transistor (TFT) including i) a first active pattern comprising a first source region, a first channel region, and a first drain region and ii) a first gate electrode insulated from the first active pattern. The display also includes a second driving circuit disposed in the second sub-pixel region and comprising a second TFT including i) a second active pattern comprising a second source region, a second channel region, and a second drain region and ii) a second gate electrode insulated from the second active pattern. The OLED display further comprises: a first pixel electrode and a second pixel electrode electrically connected to the first driving circuit and the second driving circuit, respectively; a common electrode facing the first and second pixel electrodes; a first organic emission layer interposed between the first pixel electrode and the common electrode; a second organic emission layer interposed between the second pixel electrode and the common electrode; and a light-shielding member configured to shield incident light, wherein the light-shielding member is disposed on the second TFT, wherein at least a portion of the first pixel electrode overlaps at least one of the first source region and the first drain region in the depth dimension of the OLED display, and wherein at least a portion of the light-shielding member overlaps at least one of the second source region and the second drain region in the depth dimension of the OLED display.

In the above OLED display, the light-shielding member and the second pixel electrode are disposed on the same layer, and wherein the light-shielding member is spaced apart from the second pixel electrode.

In the above OLED display, the light-shielding member extends from a third pixel electrode different from the first and second pixel electrodes and adjacent to the second sub-pixel region.

In the above OLED display, the second driving circuit comprises: a semiconductor layer comprising the first and second active patterns; a first conductive layer comprising the first and second gate electrodes, disposed on the semiconductor layer; a second conductive layer disposed on the first conductive layer; a third conductive layer disposed on the second conductive layer; and a first insulating layer, a second insulating layer, and a third insulating layer respectively interposed between the semiconductor layer and the first conductive layer, between the first and second conductive layers, and between the second and third conductive layers.

In the above OLED display, the first driving circuit comprises a first driving TFT and a first capacitor, wherein the second driving circuit comprises a second driving TFT and a second capacitor.

In the above OLED display, the first TFT and the second TFT are configured to respectively diode-connect the first driving TFT and the second driving TFT.

In the above OLED display, the first driving TFT comprises i) the first active pattern included in the semiconductor layer of the second driving circuit, ii) the first gate electrode included in the first conductive layer of the second driving circuit, and iii) a first upper electrode overlapping the first gate electrode in the depth dimension of the OLED display, included in the second conductive layer, and disposed on the first gate electrode, wherein the second driving TFT comprises i) the second driving pattern included in the semiconductor layer of the second driving circuit, ii) the second gate electrode included in the first conductive layer of the second driving circuit, and iii) a second upper electrode overlapping the second gate electrode included in the second conductive layer in the depth dimension of the OLED display, and disposed on the second gate electrode.

In the above OLED display, the light-shielding member and the second upper electrode are disposed on the same layer, wherein the light-shielding member is spaced apart from the second upper electrode.

In the above OLED display, the light-shielding member is disposed on a portion of the second upper electrode.

In the above OLED display, the second active pattern comprises a second driving source region and a second driving drain region, wherein the second driving TFT comprises a second driving source electrode electrically connected to the second driving source region and a second driving drain electrode electrically connected to the second driving drain region, and wherein the light-shielding member, the second driving source electrode, and the second driving drain electrode are disposed on the same layer.

In the above OLED display, the third conductive layer comprises a connector interposed between the second gate electrode and the second drain region, wherein the light-shielding member is disposed on a portion of the connector.

In the above OLED display, the third conductive layer comprises a plurality of data lines configured to respectively transfer a plurality of data signals to the first and second driving circuits.

In the above OLED display, the light-shielding member and the data lines are disposed on the same layer, wherein the light-shielding member is spaced apart from the data lines.

In the above OLED display, the substrate further comprises a third sub-pixel region adjacent to the second sub-pixel region, wherein the first to third sub-pixel regions respectively correspond to a red sub-pixel region, a green sub-pixel region, and a blue sub-pixel region.

In the above OLED display, the substrate further comprises: a third sub-pixel region adjacent to the second sub-pixel region; a third driving circuit disposed in the third sub-pixel region on the substrate; and a third pixel electrode electrically connected to the third driving circuit, wherein the second pixel electrode is disposed in a first row, wherein the first and third pixel electrodes are disposed in a second row adjacent to the first row, wherein the first and second pixel electrodes are alternately disposed, and wherein the second and third pixel electrodes are alternately disposed.

In the above OLED display, each of the first source region, the first drain region, the second source region, and the second drain region is formed of Si.

The above OLED display further comprises: a first common layer interposed between the first and second pixel electrodes, and between the first and second organic emission layers; and a second common layer interposed between the first organic emission layer and the second organic emission layer, and the common electrode, wherein the first common layer comprises at least one of a hole injection layer and a hole transport layer, and wherein the second common layer comprises at least one of an electron transport layer and an electron injection layer.

In the above OLED display, the light-shielding member comprises a metallic layer.

In the above OLED display, the light-shielding member is formed of at least one of Ag, Mg, Al, Pt, Pd, Au, Ni, Nd, Ir, and Cr.

In the above OLED display, the second organic emission layer is configured to emit green light.

Another aspect is an organic light-emitting diode (OLED) display, comprising: a substrate comprising a first sub-pixel region and a second sub-pixel region adjacent to the first sub-pixel region; a first driving circuit and a second driving circuit respectively disposed in the first sub-pixel region and the second sub-pixel region, wherein the first driving circuit comprises a first thin film transistor (TFT) and a second TFT; a first pixel electrode electrically connected to the first driving circuit; and a light-shielding member configured to shield incident light, wherein the light-shielding member is disposed on the second TFT, wherein at least a portion of the first pixel electrode at least partially overlaps the first TFT in the depth dimension of the OLED display, and wherein at least a portion of the light-shielding member at least partially overlaps the second TFT in the depth dimension of the OLED display.

According to a least one of the disclosed embodiments, an OLED display may solve a current reduction phenomenon due to light by shielding light incident on a semiconductor layer.

Also, an OLED display may improve quality of a produced image.

DETAILED DESCRIPTION OF CERTAIN INVENTIVE EMBODIMENTS

Figure 1:
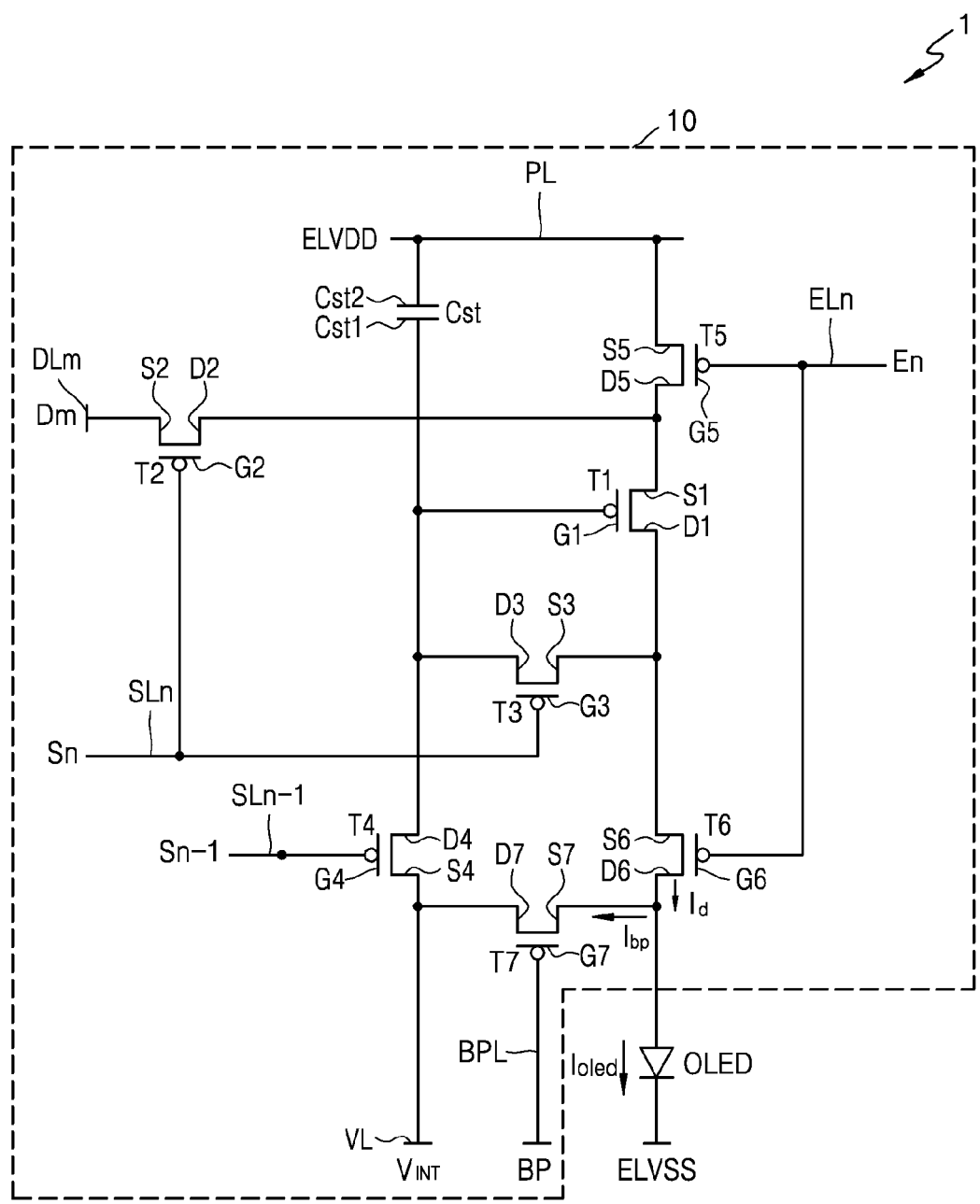
FIG. 1 is an equivalent circuit diagram of one sub-pixel of an OLED display according to an exemplary embodiment.

As the described technology allows for various changes and numerous embodiments, exemplary embodiments will be illustrated in the drawings and described in detail in the written description. An effect and a characteristic of the described technology, and a method for accomplishing these will be apparent when exemplary embodiments described below in detail are referred together with the drawings. However, the described technology is not limited to exemplary embodiments described below and may be implemented in various forms.

As used herein, the term "and/or" includes any and all combinations of one or more of the associated listed items. Expressions such as "at least one of," when preceding a list of elements, modify the entire list of elements and do not modify the individual elements of the list.

Hereinafter, exemplary embodiments are described in detail with reference to the accompanying drawings. Like reference numerals are used for like or corresponding elements when description is made with reference to the drawings, and repeated description thereof is omitted.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Also, it will be understood that when a layer, region, or component is referred to as being "connected" to another layer, region, or component, it may be "directly connected" to the other layer, region, or component or may be "indirectly connected" to the other layer, region, or component with other layer, region, or component disposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component disposed therebetween.

Sizes of elements in the drawings may be exaggerated for convenience of explanation. In other words, since sizes and thicknesses of components in the drawings are arbitrarily illustrated for convenience of explanation, the following embodiments are not limited thereto. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Also, though an active matrix (AM) OLED display having a 7Tr-1Cap structure, including seven thin film transistors (TFTs) and one capacitor in one sub-pixel and a 3Tr-2Cap structure, including three TFTs and two capacitors in one sub-pixel is illustrated in the accompanying drawings, exemplary embodiments are not limited thereto. Therefore, a display device may have a plurality of TFTs and one or more capacitors in one sub-pixel, and a separate wiring may be further formed or an existing wiring may be omitted, so that the display device may have various structures. The sub-pixels may emit light of different colors, and a plurality of sub-pixels may form one pixel. A pixel denotes a minimum unit displaying an image, and the display device generates an image via a plurality of pixels.

FIG. 1 is an equivalent circuit diagram of one sub-pixel of an OLED display 1 according to an exemplary embodiment.

The OLED display 1 may include a plurality of pixels emitting light, and each pixel may include a plurality of sub-pixels. Each sub-pixel includes an organic light-emitting diode (OLED) that emits light and a first driving circuit 10 that receives a signal from a plurality of wirings and drives the OLED.

The wirings may include a scan line SLn for transferring a scan signal Sn, a previous scan line SLn−1 for transferring a previous scan signal Sn−1, a data line DLm for transferring a data signal Dm, and a driving voltage line PL for transferring a driving voltage ELVDD. However, exemplary embodiments are not limited thereto and may further include an initialization voltage line VL for transferring an initialization voltage $V_{INT}$, and an emission control line ELn for transferring an emission control signal En as illustrated in FIG. 1. Sub-pixels are respectively disposed at points where wirings extending in a first direction cross wirings extending in a second direction that is different from the first direction.

The first driving circuit 10 may include at least two thin film transistors and at least one capacitor. However, exemplary embodiments are not limited thereto and the first driving circuit 10 may include seven TFTs T1 to T7 and one storage capacitor Cst as illustrated in FIG. 1.

The TFTs may include a driving TFT T1, a data transfer TFT T2, a compensation TFT T3, an initialization TFT T4, an operation control TFT T5, an emission control TFT T6, and a bypass TFT T7.

A gate electrode G1 of the driving TFT T1 is connected with a first electrode Cst1 of the storage capacitor Cst, a source electrode S1 of the driving TFT T1 is connected with the driving voltage line PL through the operation control TFT T5, and a drain electrode D1 of the driving TFT T1 is electrically connected with a pixel electrode of the OLED through the emission control TFT T6. The driving TFT T1 receives a data signal Dm and supplies a driving current $I_d$ to the OLED depending on a switching operation of the data transfer TFT T2.

A gate electrode G2 of the data transfer TFT T2 is connected with the scan line SLn, and a source electrode S2 of the data transfer TFT T2 is connected with the data line DLm. A drain electrode D2 of the data transfer TFT T2 is connected with the source electrode S1 of the driving TFT T1 and also connected with the driving voltage line PL through the operation control TFT T5. The data transfer TFT T2 performs a switching operation of being turned on depending on a scan signal Sn transferred via the scan line SLn, and transferring the data signal Dm transferred via the data line DLm to the source electrode S1 of the driving TFT T1.

A gate electrode G3 of the compensation TFT T3 is connected with the scan line SLn. A source electrode S3 of the compensation TFT T3 is connected with the drain electrode D1 of the driving TFT T1 and also connected with the pixel electrode of the OLED through the emission control TFT T6. A drain electrode D3 of the compensation TFT T3 is connected with all of the first electrode Cst1 of the storage capacitor Cst, a drain electrode D4 of the initialization TFT T4, and the gate electrode G1 of the driving TFT T1. The compensation TFT T3 diode-connects the driving TFT T1 by being turned on depending on the scan signal Sn transferred via the scan line SLn and connecting the gate electrode G1 with the drain electrode D1 of the driving TFT T1.

A gate electrode G4 of the initialization TFT T4 is connected with the previous scan line SLn−1, and a source electrode S4 of the initialization TFT T4 is connected with the initialization voltage line VL. A drain electrode D4 of the initialization TFT T4 is connected with all of the first electrode Cst1 of the storage capacitor Cst, the drain electrode D3 of the compensation TFT T3, and the gate electrode G1 of the driving TFT T1. The initialization TFT T4 performs an initialization operation of initializing a voltage of the gate electrode G1 of the driving TFT T1 by being turned on depending on the previous scan signal Sn−1 transferred via the previous scan line SLn−1 and transferring the initialization voltage $V_{INT}$ to the gate electrode G1 of the driving TFT T1.

A gate electrode G5 of the operation control TFT T5 is connected with the emission control line ELn. A source electrode S5 of the operation control TFT T5 is connected with the driving voltage line PL, and a drain electrode D5 of the operation control TFT T5 is connected with the source electrode S1 of the driving TFT T1 and the drain electrode D2 of the data transfer TFT T2. The operation control TFT T5 is disposed between the driving voltage line PL and the driving TFT T1. The operation control TFT T5 is turned on depending on the emission control signal En transferred via the emission control line ELn and transfers the driving voltage ELVDD to the driving TFT T1.

A gate electrode G6 of the emission control TFT T6 is connected with the emission control line ELn. A source electrode S6 of the emission control TFT T6 is connected with the drain electrode D1 of the driving TFT T1 and the source electrode S3 of the compensation TFT T3. A drain electrode D6 of the emission control TFT T6 is electrically connected with the pixel electrode of the OLED. The operation control TFT T5 and the emission control TFT T6 are substantially simultaneously (or concurrently) turned on depending on the emission control signal En transferred via the emission control line ELn, so that the driving voltage ELVDD is applied to the OLED, and an emission current $I_{oled}$ flows through the OLED.

A gate electrode G7 of the bypass TFT T7 is connected with a bypass control line BPL. A source electrode S7 of the bypass TFT T7 is connected with the pixel electrode of the OLED. A drain electrode D7 of the bypass TFT T7 is connected with the initialization voltage line VL.

The bypass TFT T7 receives a bypass signal BP via the bypass control line BPL. The bypass signal BP is a voltage of a predetermined level that may always turn off the bypass TFT T7. When the bypass TFT T7 is always turned off by the received bypass signal BP, a portion of the driving current $I_d$ flows out as a bypass current $I_{bp}$ through the bypass TFT T7. In producing a black image, the emission current $I_{oled}$ of the OLED that is reduced by an amount of the bypass current $I_{bp}$ from the driving current $I_d$ has a minimum current amount as a level that may surely express the black image. As described above, a contrast ratio may be improved by producing an exact black brightness image via the bypass TFT T7.

A second electrode Cst2 of the storage capacitor Cst is connected with the driving voltage line PL, and a common electrode of the OLED is connected with a line of a common voltage ELVSS. Therefore, the OLED displays an image by receiving the emission current $I_{oled}$ from the driving TFT T1 and emitting light. The first electrode Cst1 of the storage capacitor Cst is also referred to as a lower electrode, and the second electrode Cst2 of the storage capacitor Cst is also referred to as an upper electrode.

Figure 2:
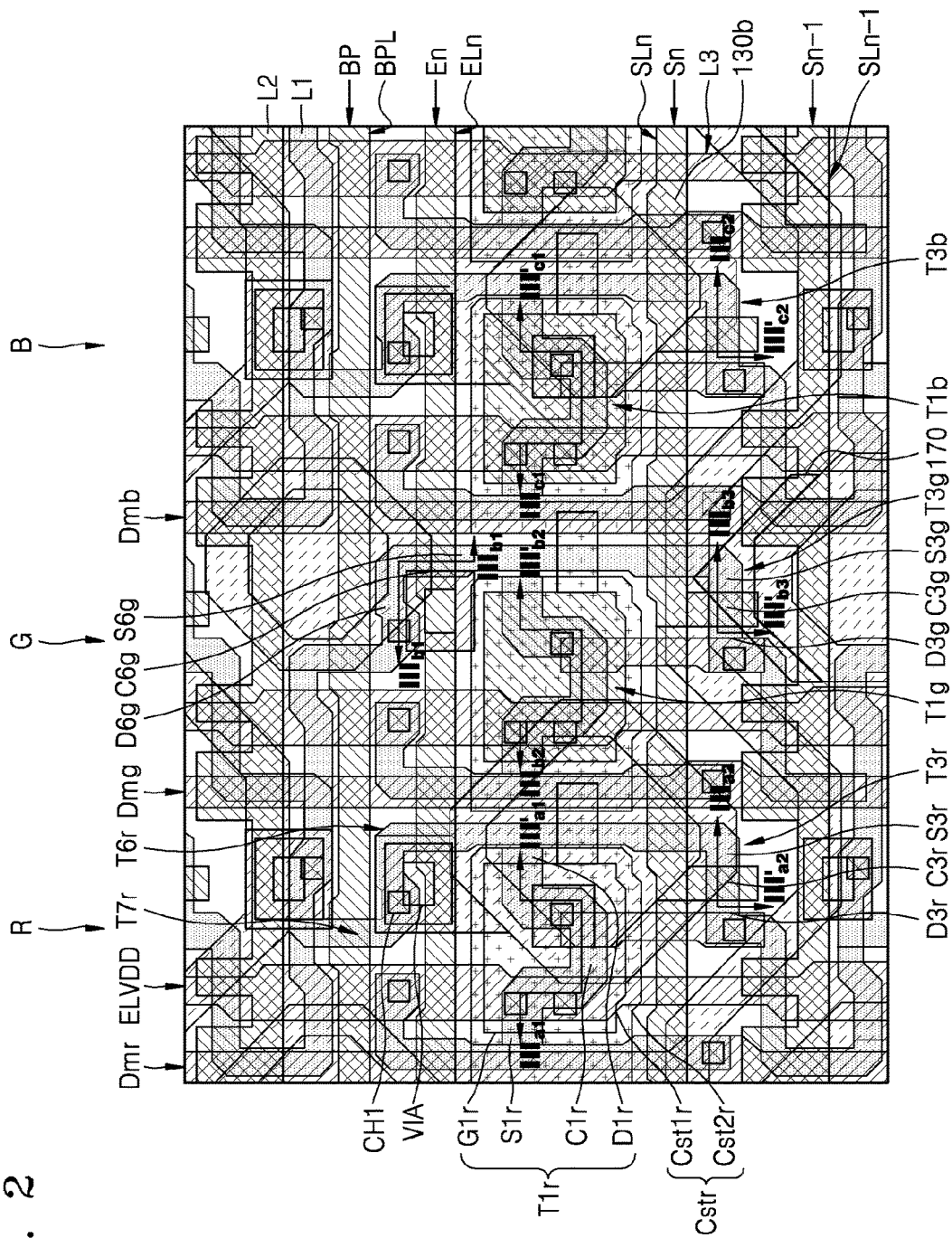
FIG. 2 is a schematic plan view illustrating one pixel included in an OLED display according to an exemplary embodiment.
Figure 3A:
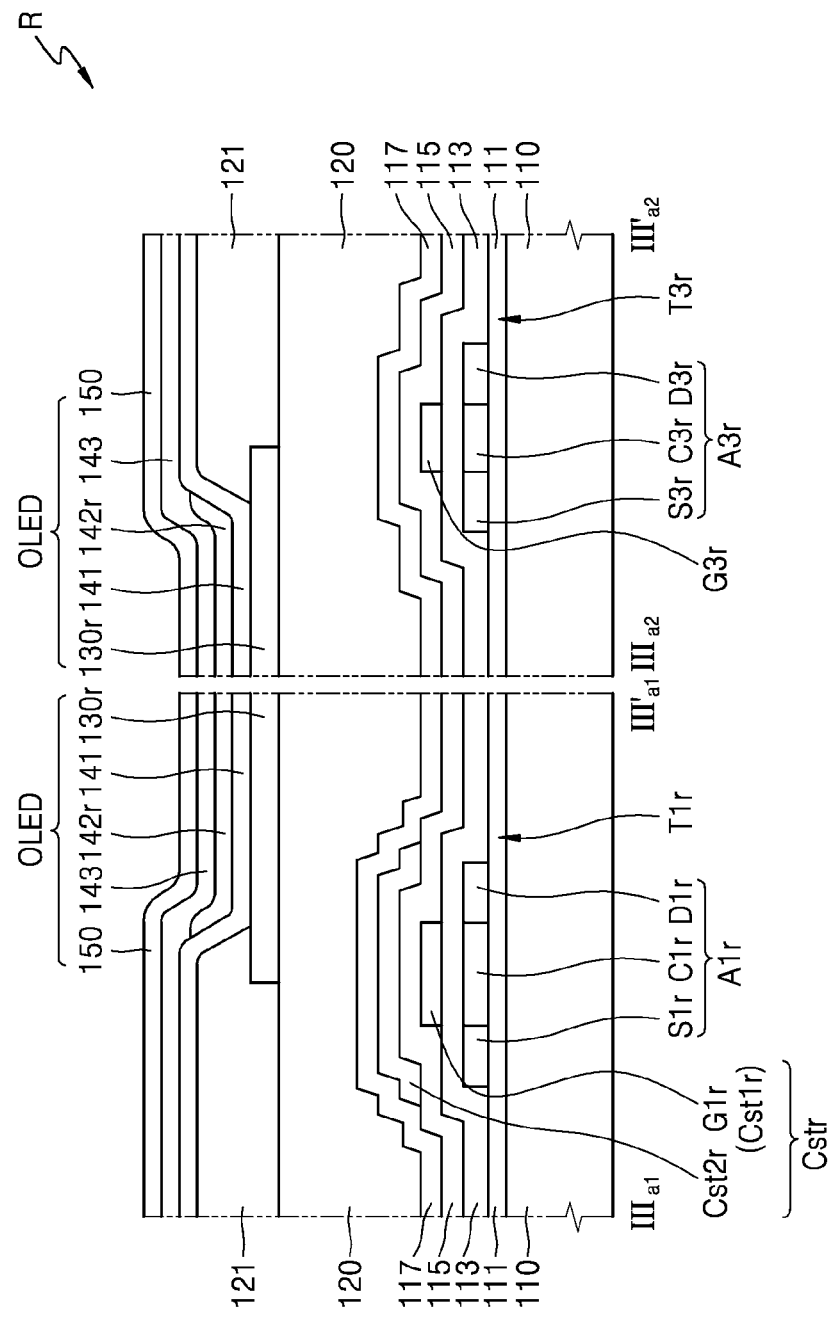
FIGS. 3A, 3B and 3C are schematic cross-sectional views taken along lines illustrated on the first sub-pixel region R, the second sub-pixel region G, and the third sub-pixel region B of FIG. 2, respectively.
Figure 3B:
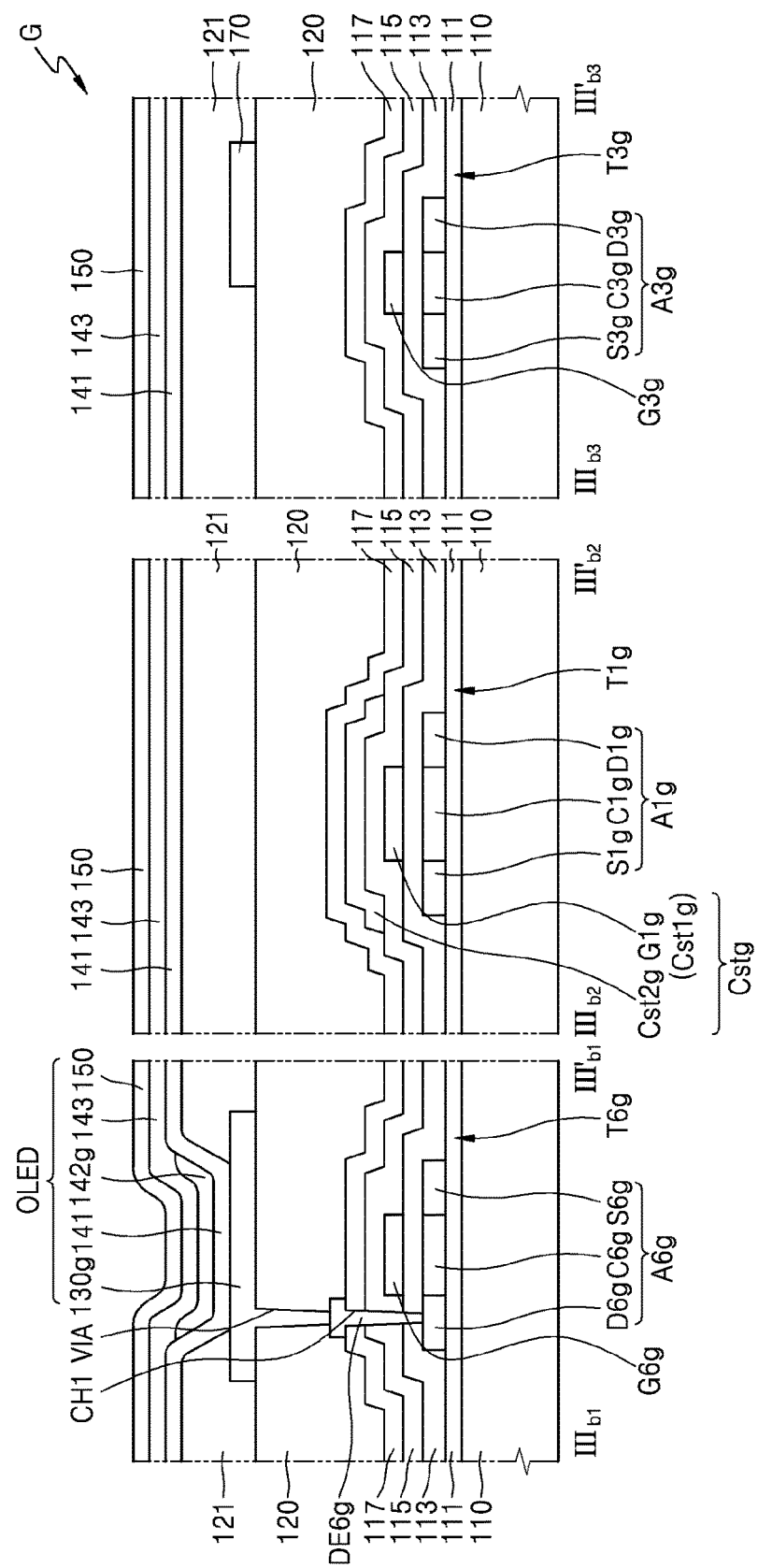
Figure 3C:
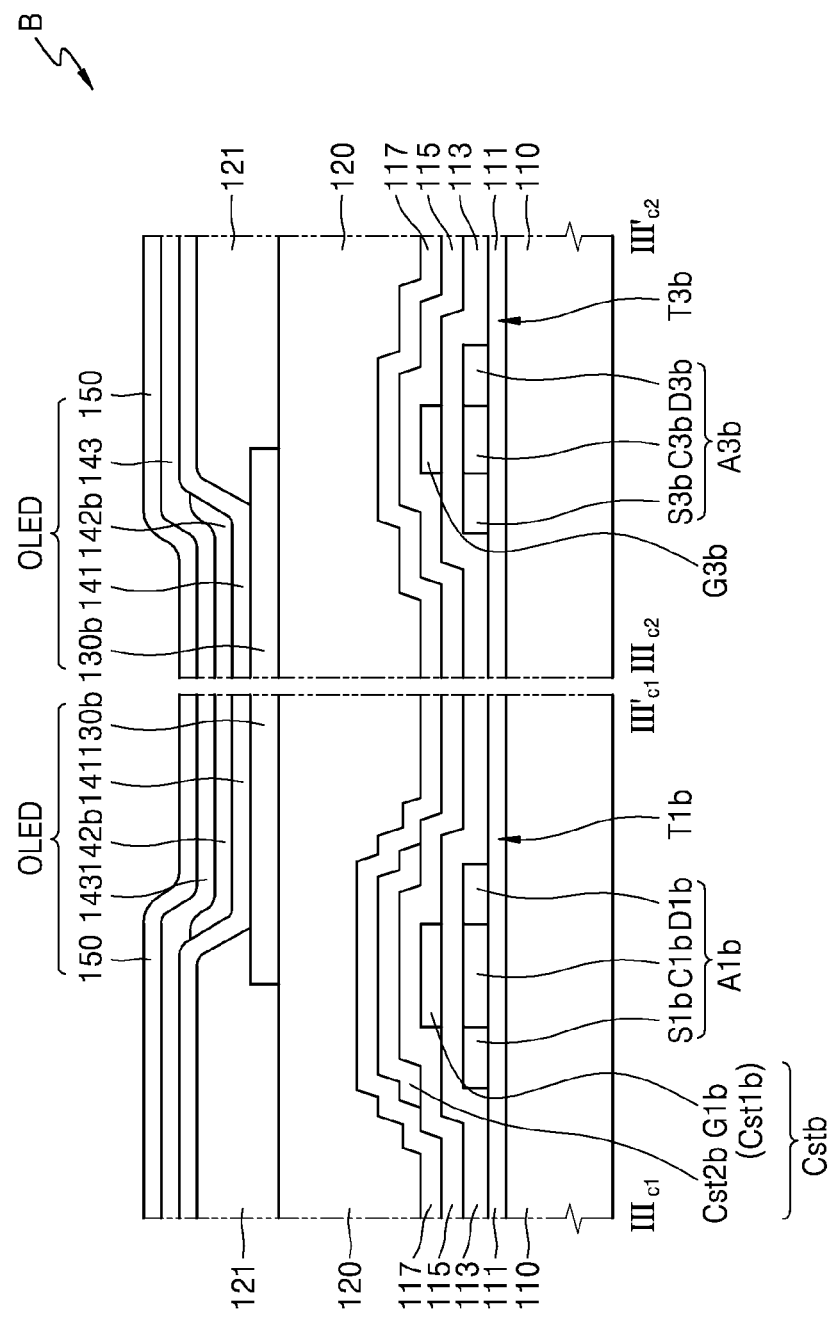

FIG. 2 is a schematic plan view illustrating one pixel included in an OLED display 1 according to an exemplary embodiment. FIG. 3A is a schematic cross-sectional view taken along lines IIIa1-III'a1 and IIIa2-III'a2 of the first sub-pixel region R of FIG. 2. FIG. 3B is a schematic cross-sectional view taken along lines IIIb1-III'b1, IIIb2-III'b2, and IIIb3-III'b3 of the second sub-pixel region G of FIG. 2. FIG. 3C is a schematic cross-sectional view taken along lines IIIc1-III'c1 and IIIc2-III'c2 of the third sub-pixel region B of FIG. 2.

Referring to FIGS. 2, 3A to 3C, one pixel of the OLED display 1 according to an exemplary embodiment may include a first sub-pixel region R, a second sub-pixel region G, and a third sub-pixel region B. The first, second, and third sub-pixel regions R, G, and B may be a red sub-pixel region, a green sub-pixel region, and a blue sub-pixel region, respectively. However, exemplary embodiments of the described technology are not limited thereto and the first sub-pixel region R, the second sub-pixel region G, and the third sub-pixel region B may be regions that may emit white light via a different combination thereof.

The shapes of the first, second, and third sub-pixel regions R, G, and B are not limited to the shapes illustrated in FIG. 2, and may have various shapes, and have different areas. According to an exemplary embodiment, the first, second, and third sub-pixel regions R, G, and B may be sequentially arranged along one direction. That is, the first sub-pixel region R and the second sub-pixel region G may be adjacent to each other, and the second sub-pixel region G and the third sub-pixel region B may be adjacent to each other.

According to an exemplary embodiment, the pixel electrode of the OLED electrically connected to a driving circuit disposed in each of the first sub-pixel region R, the second sub-pixel region G, and the third sub-pixel region B may overlap, in a plan view, a driving circuit included in at least two sub-pixels. For example, a first pixel electrode 130r of the OLED electrically connected with a driving circuit included in the first sub-pixel region R and emitting red light may overlap, in a plan view, the driving circuit included in the red sub-pixel region and a driving circuit included in the green sub-pixel region. A second pixel electrode 130g of the OLED electrically connected with a driving circuit included in the second sub-pixel region G and emitting green light may overlap, in a plan view, the driving circuit included in the green sub-pixel region and a driving circuit included in the blue sub-pixel region. A third pixel electrode 130b of the OLED electrically connected with a driving circuit included in the third sub-pixel region B and emitting blue light may overlap, in a plan view, the driving circuit included in the blue sub-pixel region and the driving circuit included in the red sub-pixel region.

In FIG. 2, assuming that a row on which the second pixel electrode 130g is disposed is referred to as a first row, and a row on which the first pixel electrode 130r and the third pixel electrode 130b are disposed is referred to as a second row, a plurality of second pixel electrodes 130g may be spaced apart from each other with a predetermined interval on the first row. The first pixel electrode 130r and the third pixel electrode 130b may be disposed in turns on the second row adjacent to the first row. Though not shown, the plurality of second pixel electrodes 130g may be spaced apart from each other with a predetermined interval on a third row adjacent to the second row, and the first pixel electrode 130r and the third pixel electrode 130b may be disposed in turns on a fourth row adjacent to the third row. This disposition of the pixel electrodes may be repeated.

In this case, the second pixel electrodes 130g disposed on the first row, and the first pixel electrode 130r and the third pixel electrode 130b disposed on the second row may be disposed alternately. Assuming that a column on which the first pixel electrode 130r is disposed is referred to as a first column and a column on which the second pixel electrode 130g is disposed is referred to as a second column, the first pixel electrode 130r and the third pixel electrode 130b may be disposed in turns on the first column, and the second pixel electrodes 130g may be spaced apart from each other with a predetermined interval on the second column adjacent to the first column. Though not shown, the third pixel electrode 130b and the first pixel electrode 130r may be disposed in turns on a third column adjacent to the second column, and the second pixel electrodes 130g may be spaced apart from each other with a predetermined interval on a fourth column adjacent to the third column. This disposition of the pixel electrodes may be repeated.

A semiconductor layer L1 bent in various shapes is disposed on a substrate 110 of the first driving circuit 10. The substrate 110 may be formed of various materials such as glass, metal, or plastic including polyethylene terephthalate (PET), polyethylene naphthalate (PEN), polyimide, etc. The semiconductor layer L1 may include a semiconductor material such as polysilicon.

A buffer layer 111 for preventing penetration of impurity elements into the substrate 110 and planarizing the substrate 110 may be disposed between the substrate 110 and the semiconductor layer L1.

A first driving TFT T1r and a first compensation TFT T3r may be disposed in the first sub-pixel region R. The first driving TFT T1r and the first compensation TFT T3r may respectively include a first driving active pattern A1r and a first compensation active pattern A3r each being one region of the semiconductor layer L1.

A second driving TFT T1g, a second compensation TFT T3g, and a second emission control TFT T6g may be disposed in the second sub-pixel region G. The second driving TFT T1g, the second compensation TFT T3g, and the second emission control TFT T6g may respectively include a second driving active pattern A1g, a second compensation active pattern A3g, and a second emission control active pattern A6g each being one region of the semiconductor layer L1.

A third driving TFT T1b and a third compensation TFT T3b may be disposed in the third sub-pixel region B. The third driving TFT T1b and the third compensation TFT T3b may respectively include a third driving active pattern A1b and a third compensation active pattern A3b each being one region of the semiconductor layer L1.

The first driving active pattern A1r, the second driving active pattern A1g, and the third driving active pattern A1b may include corresponding channel regions C1r, C1g, C1b undoped with impurities, corresponding source regions S1r, S1g, S1b, and corresponding drain regions D1r, D1g, D1b doped with impurities and having conductivity. The channel regions C1r, C1g, C1b may be a bent shape in order to maximize a length inside a narrow space.

A first compensation active pattern A3r, a second compensation active pattern A3g, and a third compensation active pattern A3b may include corresponding channel regions C3r, C3g, C3b undoped with impurities, corresponding source regions S3r, S3g, S3b, and corresponding drain regions D3r, D3g, D3b doped with impurities and having conductivity. The channel regions C3r, C3g, C3b may be a bent shape.

A second emission control active pattern A6g may include a channel region C6g undoped with impurities, a source region S6g, and a drain region D6g doped with impurities and having conductivity.

A lower gate insulating layer 113 may be disposed on the buffer layer 111 and cover the first driving active pattern A1r, the second driving active pattern A1g, the third driving active pattern A1b, the first compensation active pattern A3r, the second compensation active pattern A3g, the third compensation active pattern A3b, and the second emission control active pattern A6g. The lower gate insulating layer 113 may include a thin film of a single layer or layers formed of an inorganic material or an organic material.

The lower gate insulating layer 113 including a thin film of a single layer may be disposed between the first, second, third driving active patterns A1r, A1g, A1b, and first, second, third driving gate electrodes G1r, G1g, G1b, and between the first, second, third compensation active patterns A3r, A3g, A3b, and first, second, third compensation gate electrodes G3r, G3g, G3b, and between the second emission control active pattern A6g and a second emission control gate electrode G6g, and may include a silicon oxide or a silicon nitride.

Though not shown, the lower gate insulating layer including a thin film of layers may be disposed between an active pattern and a gate electrode. For example, a first lower gate insulating layer is disposed between the active pattern and the gate electrode, and formed of a silicon oxide. A second lower gate insulating layer may be disposed between the first lower gate insulating layer and the gate electrode, and may be formed of a silicon nitride. Since a silicon nitride has a characteristic relatively stronger against an etching solution than a silicon oxide, damage to the lower gate insulating layer may be reduced while the gate electrode is patterned by disposing the second lower gate insulating layer including a silicon nitride above the first lower gate insulating layer.

A first conductive layer L2 may be disposed on the lower gate insulating layer 113. The first conductive layer L2 may include the previous scan line SLn−1, the scan line SLn, the emission control line En, the bypass control line BPL, the first, second, third driving gate electrodes G1r, G1g, G1b, the first, second, third compensation gate electrodes G3r, G3g, G3b, and the second emission control gate electrode G6g. The first, second, third driving gate electrodes G1r, G1g, G1b may serve as first electrodes Cst1r, Cst1g, Cst1b of first, second, third storage capacitors Cstr, Cstg, Cstb. According to an exemplary embodiment, the first, second, third driving gate electrodes G1r, G1g, G1b are formed of Al. Since Al has an excellent process margin compared to other metals, in the case of using the first, second, third driving gate electrodes G1r, G1g, G1b including Al, a TFT array substrate included in an OLED display of high resolution may be easily manufactured.

An upper gate insulating layer 115 that covers the first, second, third driving gate electrodes G1r, G1g, G1b, the first, second, third compensation gate electrodes G3r, G3g, G3b, and the second emission control gate electrode G6g may be disposed on the lower gate insulating layer 113. The upper gate insulating layer 115 may be a dielectric layer disposed between the first, second, third driving gate electrodes G1r, G1g, G1b, and second electrodes Cst2r, Cst2g, Cst2b of the first, second, third storage capacitors Cstr, Cstg, Cstb.

A second conductive layer L3 may be disposed on the upper gate insulating layer 115, and may include the second electrodes Cst2r, Cst2g, Cst2b of the first, second, third storage capacitors Cstr, Cstg, Cstb. The second electrodes Cst2r, Cst2g, Cst2b of the first, second, third storage capacitors Cstr, Cstg, Cstb may overlap, in plan view, the first, second, third driving gate electrodes G1r, G1g, G1b, respectively.

A first insulating layer 117 that covers the second conductive layer L3 may be disposed on the upper gate insulating layer 115. The first insulating layer 117 may include a single layer or layers including a silicon oxide and/or a silicon nitride, etc.

The first insulating layer 117 may include a first contact hole CH1 for electrically connecting the second emission control TFT T6g with the second pixel electrode 130g of the OLED.

A third conductive layer L4 may be disposed on the first insulating layer 117. The third conductive layer L4 may include the data line DLm, the driving voltage line PL, a connection member (or connector), and a drain electrode DE6g of the second emission control TFT T6g.

A second insulating layer 120 that covers the third conductive layer L4 may be disposed on the first insulating layer 117. According to an exemplary embodiment, the second insulating layer 120 is formed of an acryl-based organic material, and an organic insulating material such as polyimide or benzocyclobutene (BCB). The second insulating layer 120 may protect a device such as a TFT disposed under the second insulating layer 120, and planarize an upper surface of the TFT disposed under the second insulating layer 120.

The first insulating layer 117 and the second insulating layer 120 may include different materials. For example, the first insulating layer 117 is formed of an inorganic insulating material, and the second insulating layer 120 is formed of an organic insulating material.

The second insulating layer 120 may include a via hole VIA that exposes the drain electrode DE6g of the second emission control TFT T6g.

The drain electrode DE6g of the second emission control TFT T6g is buried in the first contact hole CH1 included in the first insulating layer 117. Also, the drain electrode DE6g may be electrically connected with the second pixel electrode 130g of the OLED via the via hole VIA. That is, the second pixel electrode 130g may be electrically connected with the second emission control TFT T6g via the first contact hole CH1 and the via hole VIA, and consequently, electrically connected with the second driving TFT T1g that is electrically connected with the second emission control TFT T6g. Though not shown, the first pixel electrode 130r and the third pixel electrode 130b may be electrically connected with a first driving TFT T1r and a third driving TFT T1b via the first emission control TFT T6r and a third emission control TFT T6b, respectively.

The first, second, third pixel electrodes 130r, 130g, 130b of the OLED, a first light-shielding member (or first light-shielding member) 170, and the initialization voltage line VL may be disposed on the second insulating layer 120.

The first, second, third pixel electrodes 130r, 130g, 130b may include a metallic reflection layer formed of a material having a high work function, for example, Ag, Mg, Al, Pt, Pd, Au, Ni, Nd, Ir, and Cr.

According to an exemplary embodiment, at least a portion of the first pixel electrode 130r may overlap at least one of the source region S3r and the drain region D3r of the first compensation active pattern A3r, and at least a portion of the third pixel electrode 130b may overlap at least one of the source region S3b and the drain region D3b of the third compensation active pattern A3b, but the second pixel electrode 130g may not overlap the source region S3g and the drain region D3g of the second compensation active pattern A3g.

The first light-shielding member 170 may be disposed in a layer in which the first, second, third pixel electrodes 130r, 130g, 130b are disposed, and spaced apart from the first, second, third pixel electrodes 130r, 130g, 130b. The first light-shielding member 170 may be extended from a portion of a different pixel electrode disposed in a row in which the second pixel electrode 130g is disposed, but is not limited thereto.

The first light-shielding member 170 may include a metallic layer including a single layer or layers. The first light-shielding member 170 may include a metallic reflection layer formed of a material such as Ag, Mg, Al, Pt, Pd, Au, Ni, Nd, Ir, and Cr. The first light-shielding member 170 may be disposed on the second compensation TFT T3g disposed in the second sub-pixel region G. At least a portion of the first light-shielding member 170 may overlap at least one of the source region S3g and the drain region D3g of the second compensation active pattern A3g included in the second compensation TFT T3g and may shield light incident on at least one of the source region S3g and the drain region D3g of the second compensation active pattern A3g.

A pixel-defining layer 121 that divides sub-pixels may be disposed on the second insulating layer 120. The pixel-defining layer 121 may cover the circumference of the first, second, third pixel electrodes 130r, 130g, 130b such that the pixel-defining layer 121 exposes the upper surfaces of the first, second, third pixel electrodes 130r, 130g, 130b. The pixel-defining layer 121 may cover the first light-shielding member 170.

A first common layer 141, first, second, third organic emission layers 142r, 142g, 142b, a second common layer 143, and a common electrode 150 may be disposed on portions of the first, second, third pixel electrodes 130r, 130g, 130b that are exposed by the pixel-defining layer 121. The first common layer 141 may include a hole injection layer and/or a hole transport layer. The second common layer 143 may include an electron transport layer and/or an electron injection layer. Depending on the embodiment, other various functional layers may be further disposed between the pixel electrode 130 and the common electrode 150.

The first, second, third organic emission layers 142r, 142g, 142b may emit red light, green light, and blue light, respectively.

The common electrode 150 may be disposed such that the common electrode 150 is common to the first, second, third sub-pixel regions R, G, B. The common electrode 150 may face the first pixel electrode 130r, the second pixel electrode 130g, and the third pixel electrode 130b.

Though not shown, an encapsulation substrate (not shown) or an encapsulation layer (not shown) may be disposed on the common electrode 150.

Reference numerals T2r, T2g, T2b illustrated in FIG. 2 denote the data transfer TFT T2 of FIG. 1 disposed in the first sub-pixel region R, the second sub-pixel region G, and the third sub-pixel region B, respectively. Reference numerals T3r, T3g, T3b illustrated in FIG. 2 denote the compensation TFT T3 of FIG. 1 disposed in the first sub-pixel region R, the second sub-pixel region G, and the third sub-pixel region B, respectively. Reference numerals T4r, T4g, T4b illustrated in FIG. 2 denote the initialization TFT T4 of FIG. 1 disposed in the first sub-pixel region R, the second sub-pixel region G, and the third sub-pixel region B, respectively. Reference numerals T5r, T5g, T5b illustrated in FIG. 2 denote the operation control TFT T5 of FIG. 1 disposed in the first sub-pixel region R, the second sub-pixel region G, and the third sub-pixel region B, respectively. Reference numerals T7r, T7g, T7b illustrated in FIG. 2 denote the bypass TFT T7 of FIG. 1 disposed in the first sub-pixel region R, the second sub-pixel region G, and the third sub-pixel region B, respectively.

Figure 4:
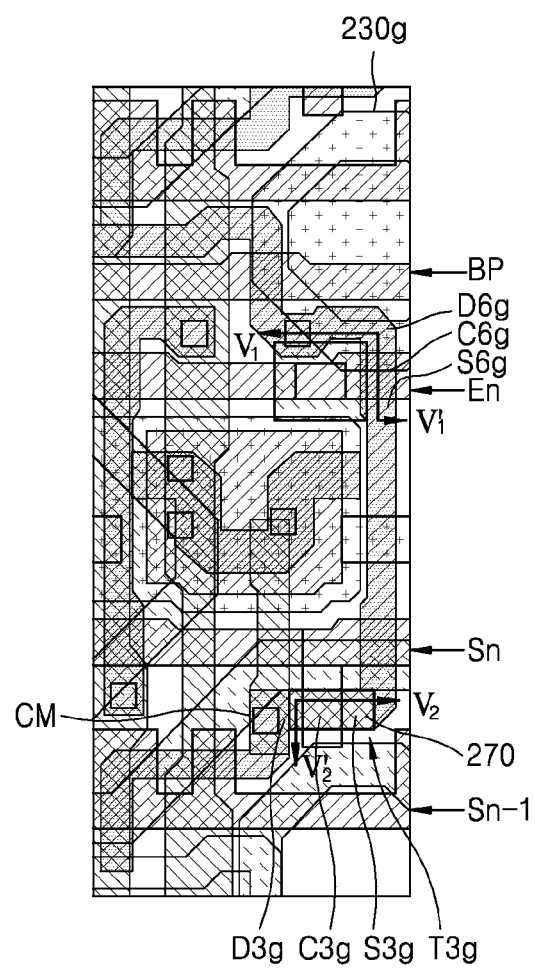
FIG. 4 is a schematic plan view illustrating one sub-pixel included in an OLED display according to another exemplary embodiment.
Figure 5:
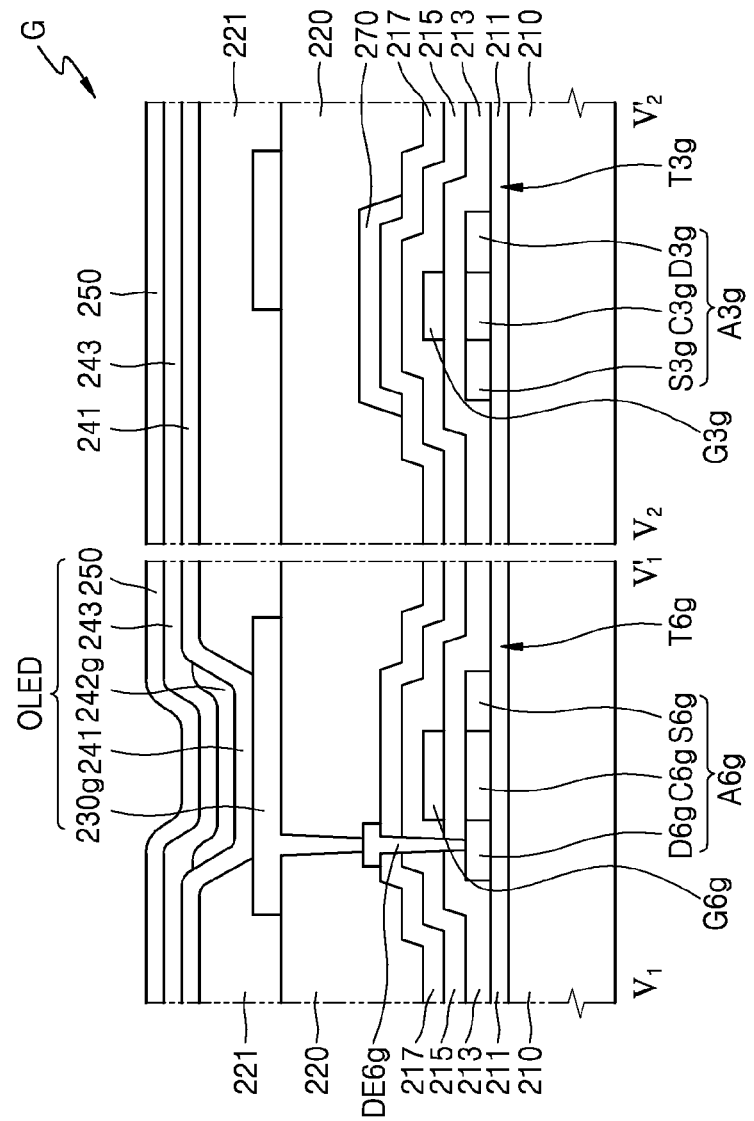
FIG. 5 is a schematic cross-sectional view taken along lines illustrated in FIG. 4.
Figure 6:
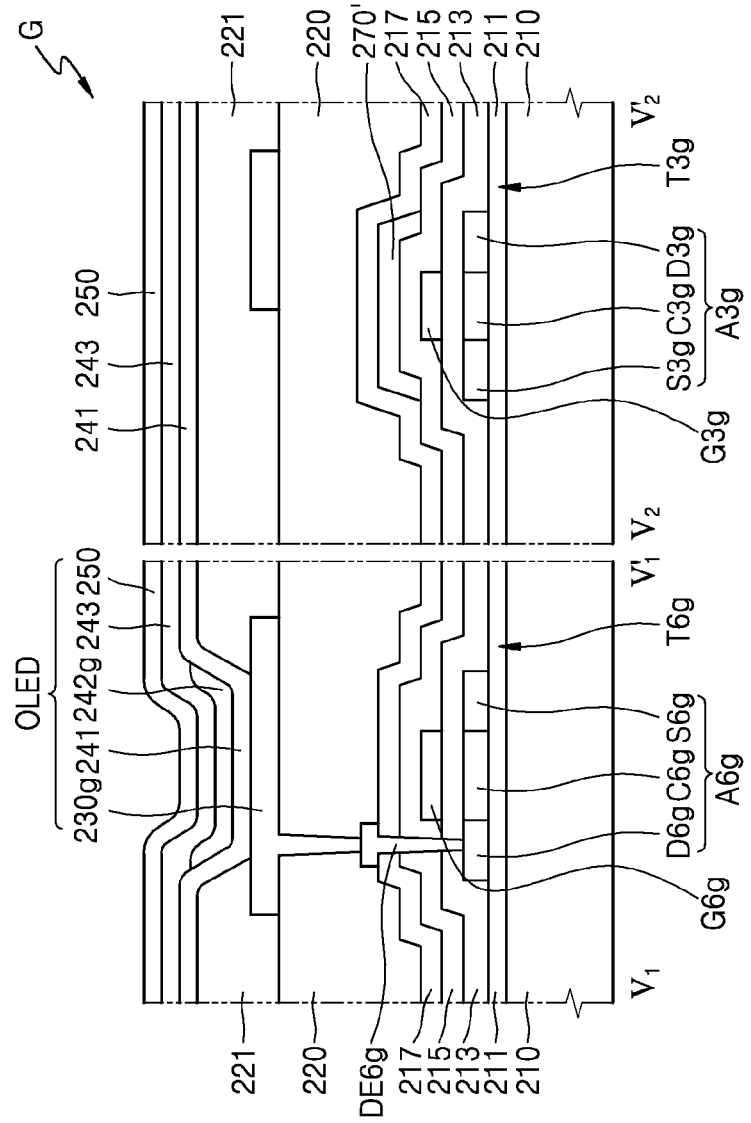
FIG. 6 is another schematic cross-sectional view taken along lines illustrated in FIG. 4.

FIG. 4 is a schematic plan view illustrating one sub-pixel included in an OLED display 1 according to another exemplary embodiment. FIG. 5 is a schematic cross-sectional view taken along lines V1-V'1 and V2-V'2 of FIG. 4. FIG. 6 is another schematic cross-sectional view taken along lines V1-V'1 and V2-V'2 of FIG. 4.

Referring to FIGS. 4 and 5, one pixel of the OLED display 1 according to another exemplary embodiment includes a second sub-pixel region G, and the second sub-pixel region G may be a green sub-pixel region.

A semiconductor layer L1 bent in various shapes is disposed on a substrate 210.

A buffer layer 211 for preventing penetration of impurity elements into the substrate 210 and planarizing the substrate 210 may be disposed between the substrate 210 and the semiconductor layer L1.

A second compensation TFT T3g and a second emission control TFT T6g may be disposed in the second sub-pixel region G. The second compensation TFT T3g and the second emission control TFT T6g may respectively include a second compensation active pattern A3g and a second emission control active pattern A6g each being one region of the semiconductor layer L1.

The second compensation active pattern A3g may include a channel region C3g undoped with impurities and a source region S3g and a drain region D3g doped with impurities and having conductivity. The channel region C3g may be a bent shape.

The second emission control active pattern A6g may include a channel region C6g undoped with impurities and a source region S6g and a drain region D6g doped with impurities and having conductivity. The channel region C6g may be a bent shape.

A lower gate insulating layer 213 may be disposed on the buffer layer 211 to cover the second compensation active pattern A3g and the second emission control active pattern A6g.

A first conductive layer L2 may be disposed on the lower gate insulating layer 213. The first conductive layer L2 may include the previous scan line SLn−1, the scan line SLn, the emission control line ELn, the bypass control line BPL, the second compensation gate electrode G3g, and the second emission control gate electrode G6g.

An upper gate insulating layer 215 that covers the second compensation gate electrode G3g and the second emission control gate electrode G6g, and a first insulating layer 217 may be disposed on the lower gate insulating layer 213.

The first insulating layer 217 may include a contact hole for electrically connecting the second emission control TFT T6g with a second pixel electrode 230g of the OLED.

A third conductive layer L4 may be disposed on the first insulating layer 217, and may include the data line DLm, the driving voltage line PL, the drain electrode DE6g of the second emission control TFT T6g, and a second light-shielding member (or second light-shielding member) 270.

The second light-shielding member 270 may be disposed in a layer in which the data line DLm of the second sub-pixel region G is disposed, and spaced apart from the data line DLm of the second sub-pixel region G. The second light-shielding member 270 may be extended from the connection member that connects the second driving gate electrode G1g with the second compensation drain electrode as illustrated in FIG. 4, but is not limited thereto.

The second light-shielding member 270 may include a metallic layer of a single layer or layers and include a metallic reflection layer formed of a material such as Ag, Mg, Al, Pt, Pd, Au, Ni, Nd, Ir, and Cr. The second light-shielding member 270 may overlap at least one of the source region S3g and the drain region D3g of the second compensation active pattern A3g included in the second compensation TFT T3g and shield light incident on at least one of the source region S3g and the drain region D3g of the second compensation active pattern A3g.

A second insulating layer 220 that covers the third conductive layer L4 may be disposed on the first insulating layer 217. That is, the second insulating layer 220 may cover the second light-shielding member 270. The first insulating layer 217 and the second insulating layer 220 may include different materials, respectively. For example, the first insulating layer 217 is formed of an inorganic insulating material, and the second insulating layer 220 is formed of an organic insulating material.

The drain electrode DE6g of the second emission control TFT T6g is buried in the contact hole included in the first insulating layer 217. The second insulating layer 220 includes a via hole VIA that exposes the drain electrode DE6g of the second emission control TFT T6g. The drain electrode DE6g may be electrically connected with the second pixel electrode 230g of the OLED via the via hole VIA. That is, the second pixel electrode 230g may be electrically connected with the second emission control TFT T6g via the contact hole and the via hole VIA, and consequently electrically connected with the second driving TFT T1g that is electrically connected with the second emission control TFT T6g.

The second pixel electrode 230g of the OLED and the initialization voltage line VL may be disposed on the second insulating layer 220.

The second pixel electrode 230g may include a metallic reflection layer formed of a material having a high work function, for example, Ag, Mg, Al, Pt, Pd, Au, Ni, Nd, Ir, and Cr. According to an exemplary embodiment, the second pixel electrode 230g does not overlap the source region S3g and the drain region D3g of the second compensation active pattern A3g included in the second compensation TFT T3g.

A pixel-defining layer 221 that divides sub-pixels may be disposed on the second insulating layer 220. The pixel-defining layer 221 may cover the circumference of the second pixel electrode 230g such that the pixel-defining layer 221 exposes the upper surface of the second pixel electrode 230g.

A first common layer 241, a second organic emission layer 242g, a second common layer 243, and a common electrode 250 may be disposed on a portion of the second pixel electrode 230g that is exposed by the pixel-defining layer 221.

The first common layer 241 may include a hole injection layer and a hole transport layer. The second common layer 243 may include an electron transport layer and an electron injection layer.

The second organic emission layer 242g may emit green light.

Though not shown, an encapsulation substrate (not shown) or an encapsulation layer (not shown) may be disposed on the common electrode 250.

A reference numeral T1g illustrated in FIG. 4 denotes the driving TFT T1 of FIG. 1 disposed in the second sub-pixel region G, a reference numeral T2g illustrated in FIG. 4 denotes the data transfer TFT T2 of FIG. 1 disposed in the second sub-pixel region G, a reference numeral T4g illustrated in FIG. 4 denotes the initialization TFT T4 of FIG. 1 disposed in the second sub-pixel region G, a reference numeral T5g illustrated in FIG. 4 denotes the operation control TFT T5 of FIG. 1 disposed in the second sub-pixel region G, and a reference numeral T7g illustrated in FIG. 4 denotes the bypass TFT T7 of FIG. 1 disposed in the second sub-pixel region G.

Hereinafter, description of the same portion as that described in the above is omitted or briefly described.

Referring to FIGS. 4 and 6, one pixel of the OLED display 1 according to another exemplary embodiment includes the second sub-pixel region G, and the second sub-pixel region G may be a green sub-pixel region.

The semiconductor layer L1 is disposed on the substrate 210, and the buffer layer 211 may be disposed between the substrate 210 and the semiconductor layer L1.

The second compensation TFT T3g and the second emission control TFT T6g respectively including the second compensation active pattern A3g and the second emission control active pattern A6g each being one region of the semiconductor layer L1 may be disposed in the second sub-pixel region G.

The lower gate insulating layer 213 may be disposed on the buffer layer 211 to cover the second compensation active pattern A3g and the second emission control active pattern A6g.

The first conductive layer L2 may be disposed on the lower gate insulating layer 213. The first conductive layer L2 may include the second compensation gate electrode G3g and the second emission control gate electrode G6g.

The upper gate insulating layer 215 that covers the second compensation gate electrode G3g and the second emission control gate electrode G6g may be disposed on the lower gate insulating layer 213.

The second conductive layer L3 may be disposed on the upper gate insulating layer 215, and may include a second electrode Cst2g of a second storage capacitor Cstg, and a third light-shielding member (or third light-shielding member) 270'.

The third light-shielding member 270' may be disposed in a layer in which the second electrode Cst2g of the second storage capacitor Cstg, and spaced apart from the second electrode Cst2g of the second storage capacitor Cstg. Alternatively, the third light-shielding member 270' may be extended from a portion of the second electrode Cst2g of the second storage capacitor Cstg, and is not limited thereto.

The third light-shielding member 270' may include a metallic layer of a single layer or layers and include a metallic reflection layer formed of a material such as Ag, Mg, Al, Pt, Pd, Au, Ni, Nd, Ir, and Cr. The third light-shielding member 270' may overlap at least one of the source region S3g and the drain region D3g of the second compensation active pattern A3g included in the second compensation TFT T3g and shield light incident on at least one of the source region S3g and the drain region D3g of the second compensation active pattern A3g.

The third conductive layer L4 may be disposed on the first insulating layer 217, and may include the drain electrode DE6g of the second emission control TFT T6g.

The drain electrode DE6g of the second emission control TFT T6g is buried in the contact hole included in the first insulating layer 217.

The second insulating layer 220 that covers the third conductive layer L4 may be disposed on the first insulating layer 217.

The second pixel electrode 230g of the OLED and the pixel-defining layer 221 may be disposed on the second insulating layer 220. The pixel-defining layer 230g may cover the circumference of the second pixel electrode 230g such that the pixel-defining layer 230g exposes the upper surface of the second pixel electrode 230g.

The first common layer 241, the second organic emission layer 242g, the second common layer 243, and the common electrode 250 may be disposed on a portion of the second pixel electrode 230g that is exposed by the pixel-defining layer 221.

The first common layer 241 may include a hole injection layer and a hole transport layer. The second common layer 243 may include an electron transport layer and an electron injection layer.

The second organic emission layer 242g may emit green light.

Though not shown, an encapsulation substrate (not shown) or an encapsulation layer (not shown) may be disposed on the common electrode 250.

Figure 7:
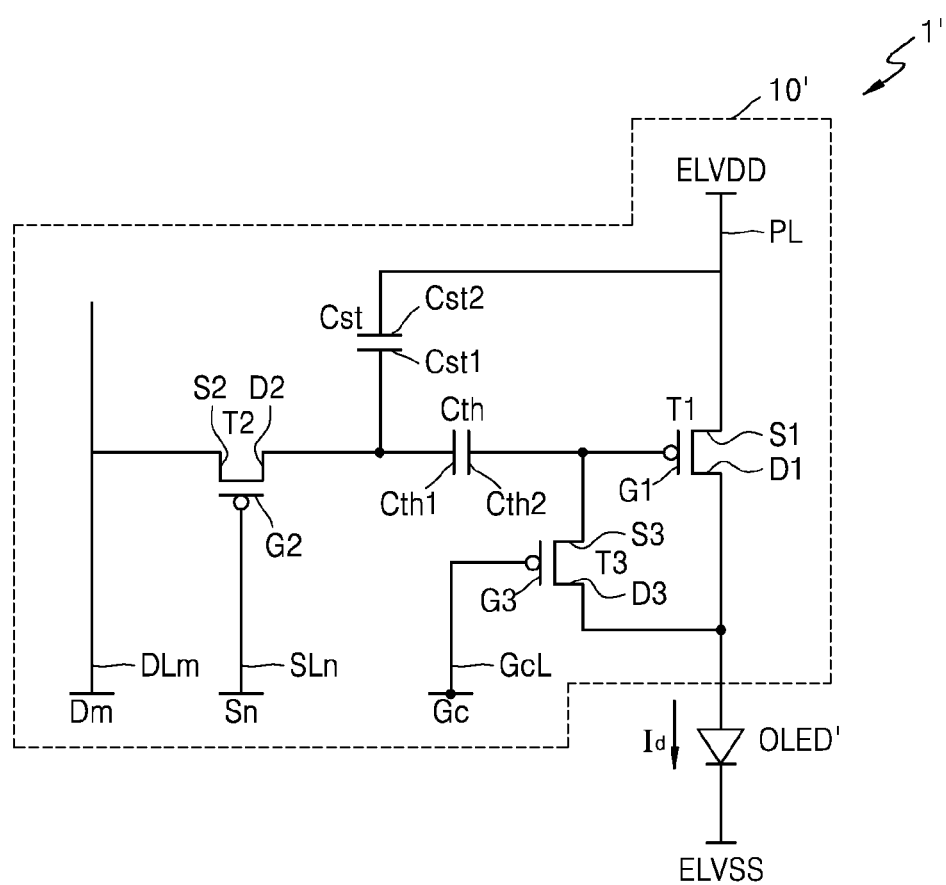
FIG. 7 is an equivalent circuit diagram of one sub-pixel of an OLED display according to another exemplary embodiment.
Figure 8:
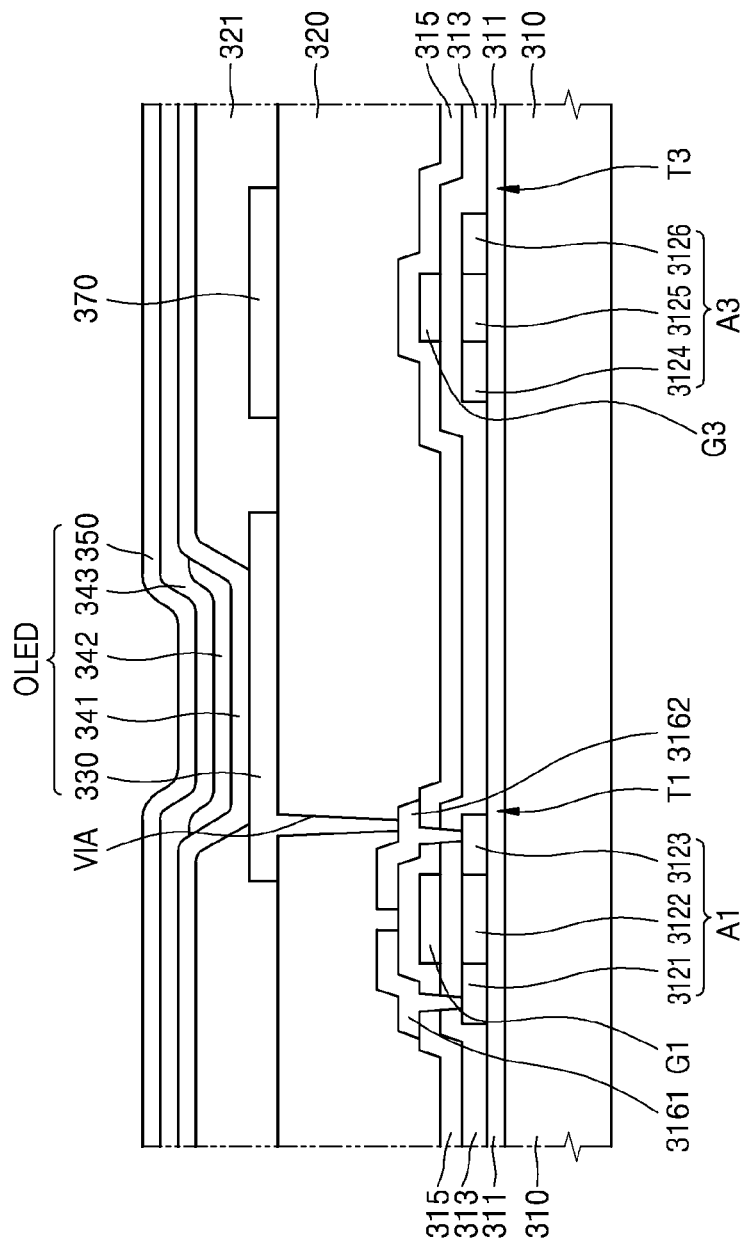
FIG. 8 is a schematic cross-sectional view illustrating a portion of one sub-pixel of the OLED display of FIG. 7.

FIG. 7 is an equivalent circuit diagram of one sub-pixel of an OLED display 1' according to another exemplary embodiment. FIG. 8 is a schematic cross-sectional view illustrating a portion of one sub-pixel of the OLED display 1' of FIG. 7.

The OLED display 1' according to another exemplary embodiment may include a sub-pixel illustrated in FIGS. 7 and 8, and the sub-pixel illustrated in FIGS. 7 and 8 may include an OLED that emits at least one of red light, green light, and blue light.

Referring to FIG. 7, the OLED display 1' according to another exemplary embodiment includes a plurality of pixels each including a plurality of sub-pixels. Each sub-pixel includes an OLED' that emits light, and a second driving circuit 10' that receives a signal from a plurality of wirings and drives the OLED'.

The wirings may include a scan line SLn that transfers a scan signal Sn, a data line DLm that transfers a data signal Dm, a driving voltage line PL that transfers a driving voltage ELVDD, and a compensation control line GcL that transfers a compensation control signal Gc. Sub-pixels are respectively disposed at points where wirings extending in a first direction cross wirings extending in a second direction that is different from the first direction.

The second driving circuit 10' may include at least two TFTs and at least one capacitor. However, exemplary embodiments of the described technology are not limited thereto and the second driving circuit 10' may include three TFTs T1 to T3 and two capacitors Cst and Cth as illustrated in FIG. 7.

The TFTs may include a driving TFT T1, a data transfer TFT T2, and a compensation TFT T3.

A gate electrode G1 of the driving TFT T1 is connected with a second electrode Cth2 of the compensation capacitor Cth, a source electrode S1 of the driving TFT T1 is connected with the driving voltage line PL that supplies the driving voltage ELVDD, and a drain electrode D1 of the driving TFT T1 is electrically connected with a pixel electrode of the OLED'. The driving TFT T1 receives the data signal Dm and supplies a driving current $I_d$ to the OLED' depending on a switching operation of the data transfer TFT T2.

A gate electrode G2 of the data transfer TFT T2 is connected with the scan line SLn, a source electrode S2 of the data transfer TFT T2 is connected with the data line DLm, and a drain electrode D2 of the data transfer TFT T2 is connected with the gate electrode G1 of the driving TFT T1 by way of the compensation capacitor Cth. The data transfer TFT T2 performs a switching operation of being turned on depending on the scan signal Sn transferred via the scan line SLn and transferring the data signal Dm transferred via the data line DLm to the gate electrode G1 of the driving TFT T1.

A gate electrode G3 of the compensation TFT T3 is connected with a compensation control line GcL, a source electrode S3 of the compensation TFT T3 is connected with all of the second electrode Cth2 of the compensation capacitor Cth and the gate electrode G1 of the driving TFT T1, and a drain electrode D3 of the compensation TFT T3 is electrically connected with the pixel electrode of the OLED'. The compensation TFT T3 is turned on depending on a compensation control signal transferred via the compensation control line GcL, and diode-connects the driving TFT T1 by connecting the gate electrode G1 with the drain electrode D1 of the driving TFT T1.

A second electrode Cst2 of the storage capacitor Cst is connected with the driving voltage line PL, and a first electrode Cst1 of the storage capacitor Cst is connected with the drain electrode D2 of the data transfer TFT T2 and the first electrode Cth1 of the compensation capacitor Cth together.

The first electrode Cth1 of the compensation capacitor Cth is connected with the drain electrode D2 of the data transfer TFT T2 and the first electrode Cst1 of the storage capacitor Cst together, and the second electrode Cth2 of the compensation capacitor Cth is connected with the gate electrode G1 of the driving TFT T1 and the source electrode S3 of the compensation TFT T3 together.

The pixel electrode of the OLED' is connected with the second driving circuit 10', and a common electrode of the OLED' is connected with a line of a common voltage ELVSS. Therefore, the OLED' displays an image by receiving a driving current $I_d$ from the driving TFT T1 and emitting light.

Referring to FIG. 8, a semiconductor layer bent in various shapes is disposed on a substrate 310 of the second driving portion 10' according to an exemplary embodiment. The substrate 310 may include various materials such as glass, metal, or plastic including polyethylene terephthalate (PET), polyethylene naphthalate (PEN), polyimide, etc. The semiconductor layer may include a semiconductor material such as polysilicon.

The semiconductor layer may include a driving active pattern A1 and a compensation active pattern A3. The driving active pattern A1 and the compensation active pattern A3 respectively include channel regions 3122 and 3125 undoped with impurities and source regions 3123 and 3126 and drain regions 3121 and 3124 doped with impurities and having conductivity.

A buffer layer 311 preventing penetration of impurity elements into the substrate 310 and planarizing the substrate 310 may be disposed on the substrate 310.

A lower gate insulating layer 313 may be disposed on the buffer layer 311 to cover the driving active pattern A1 and the compensation active pattern A3. The lower gate insulating layer 313 may include a thin film of a single layer or layers including an inorganic material or an organic material.

The lower gate insulating layer 313 may be disposed between the driving active pattern A1 and the driving gate electrode G1 and between the compensation active pattern A3 and the compensation gate electrode G3, and may include a silicon oxide or a silicon nitride.

Though not shown, the lower gate insulating layer including a multi-layered thin film may be disposed between an active pattern and a gate electrode. For example, a first lower gate insulating layer is disposed between an active pattern and a gate electrode, and be formed of a silicon oxide. A second lower gate insulating layer may be disposed between the first lower gate insulating layer and the gate electrode, and be formed of a silicon nitride.

A first conductive layer may be disposed on the lower gate insulating layer 313. The first conductive layer may include the scan line SLn, the compensation control line GcL, the driving gate electrode G1, and the compensation gate electrode G3.

An upper gate insulating layer 315 that covers the driving gate electrode G1 and the compensation gate electrode G3 may be disposed on the lower gate insulating layer 313.

A second conductive layer may be disposed on the upper gate insulating layer 315. The second conductive layer may include the data line DLm, the driving voltage line PL, a drain electrode 3161 of the driving TFT T1, and a source electrode 3162 of the driving TFT T1.

The drain electrode 3161 and the source electrode 3162 of the driving TFT T1 are respectively connected with the drain region 3121 and the source region 3123 of the driving active pattern A1.

A first insulating layer 320 that covers the second conductive layer may be disposed on the upper gate insulating layer 315. The first insulating layer 320 may be formed of an acryl-based organic material, and an organic insulating material such as polyimide or benzocyclobutene (BCB). The first insulating layer 320 may protect a device such as a TFT disposed under the first insulating layer 320, and planarize the upper surface of the TFT disposed under the first insulating layer 320.

The first insulating layer 320 may include a via hole VIA that exposes the source electrode 3162 of the driving TFT T1. The source electrode 3162 of the driving TFT T1 may be electrically connected with a pixel electrode 330 of the OLED' through the via hole VIA.

The pixel electrode 330 of the OLED' and a third light-shielding member 370 may be disposed on the first insulating layer 320.

The pixel electrode 330 may include a metallic reflection layer formed of a material having a high work function, for example, Ag, Mg, Al, Pt, Pd, Au, Ni, Nd, Ir, and Cr.

According to an exemplary embodiment, the pixel electrode 330 overlaps at least one of the source region 3123 and the drain region 3121 of the driving active pattern A1, but does not overlap the source region 3126 and the drain region 3124 of the compensation active pattern A3.

The third light-shielding member 370 may be disposed in a layer in which the pixel electrode 330 is disposed, and spaced apart from the pixel electrode 330. The third light-shielding member 370 may include a metallic layer of a single layer or layers. The third light-shielding member 370 may include a metallic reflection layer including a material such as Ag, Mg, Al, Pt, Pd, Au, Ni, Nd, Ir, and Cr. The third light-shielding member 370 may overlap at least one of the source region 3126 and the drain region 3124 of the compensation active pattern A3 and shield light incident on at least one of the source region 3126 and the drain region 3124 of the compensation active pattern A3.

Though not shown, the third light-shielding member 370 may be disposed in a layer in which the drain electrode 3161 and the source electrode 3162 are disposed, and spaced apart from the drain electrode 3161 and the source electrode 3162.

A pixel-defining layer 321 that divides respective sub-pixels may be disposed on the first insulating layer 320. The pixel-defining layer 321 may cover the circumference of the pixel electrode 330 such that the pixel-defining layer 321 exposes the upper surface of the pixel electrode 330. The pixel-defining layer 321 may cover the third light-shielding member 370.

A first common layer 341, an organic emission layer 342, a second common layer 343, and a common electrode 350 may be disposed on a portion of the pixel electrode 330 that is exposed by the pixel-defining layer 321. The first common layer 341 may include a hole injection layer and a hole transport layer. The second common layer 343 may include an electron transport layer and an electron injection layer. Depending on the embodiment, other various functional layers may be further disposed between the pixel electrode 330 and the common electrode 350.

The organic emission layer 342 may emit at least one of red light, green light, and blue light.

The common electrode 350 may be disposed such that the common electrode 350 is common to all sub-pixel regions of the OLED display 1'.

Though not shown, an encapsulation substrate (not shown) or an encapsulation layer (not shown) may be disposed on the common electrode 350.

While the inventive technology been described with reference to the figures, it will be understood by those of ordinary skill in the art that various changes in form and details may be made therein without departing from the spirit and scope as defined by the following claims.

What is claimed is:

1. An organic light-emitting diode (OLED) display, comprising:
   a substrate comprising a first sub-pixel region and a second sub-pixel region;
   a first driving circuit disposed in the first sub-pixel region and comprising a first thin film transistor (TFT) including i) a first active pattern comprising a first source region, a first channel region, and a first drain region and ii) a first gate electrode insulated from the first active pattern;

a second driving circuit disposed in the second sub-pixel region and comprising a second TFT including i) a second active pattern comprising a second source region, a second channel region, and a second drain region and ii) a second gate electrode insulated from the second active pattern;

a first pixel electrode and a second pixel electrode electrically connected to the first driving circuit and the second driving circuit, respectively;

a common electrode facing the first and second pixel electrodes; and a light-shielding member shield incident light, wherein the light-shielding member is disposed on the second TFT, wherein at least a portion of the first pixel electrode overlaps at least one of the first source region and the first drain region in the depth dimension of the OLED display, and wherein at least a portion of the light-shielding member overlaps at least one of the second source region and the second drain region in the depth dimension of the OLED display.

2. The OLED display of claim 1, wherein the light-shielding member and the second pixel electrode are disposed on the same layer, and wherein the light-shielding member is spaced apart from the second pixel electrode.

3. The OLED display of claim 1, wherein the light-shielding member extends from a third pixel electrode different from the first and second pixel electrodes and adjacent to the second sub-pixel region.

4. The OLED display of claim 1, wherein the second driving circuit comprises:
a semiconductor layer comprising the first and second active patterns;
a first conductive layer comprising the first and second gate electrodes, disposed on the semiconductor layer;
a second conductive layer disposed on the first conductive layer;
a third conductive layer disposed on the second conductive layer; and
a first insulating layer, a second insulating layer, and a third insulating layer respectively interposed between the semiconductor layer and the first conductive layer, between the first and second conductive layers, and between the second and third conductive layers.

5. The OLED display of claim 4, wherein the first driving circuit comprises a first driving TFT and a first capacitor, and wherein the second driving circuit comprises a second driving TFT and a second capacitor.

6. The OLED display of claim 5, wherein the first TFT and the second TFT are configured to respectively diode-connect the first driving TFT and the second driving TFT.

7. The OLED display of claim 5, wherein the first driving TFT comprises i) the first active pattern included in the semiconductor layer of the first driving circuit, ii) the first gate electrode included in the first conductive layer of the first driving circuit, and iii) a first upper electrode overlapping the first gate electrode in the depth dimension of the OLED display, included in the second conductive layer, and disposed on the first gate electrode, and
wherein the second driving TFT comprises i) the second driving pattern included in the semiconductor layer of the second driving circuit, ii) the second gate electrode included in the first conductive layer of the second driving circuit, and iii) a second upper electrode overlapping the second gate electrode included in the second conductive layer in the depth dimension of the OLED display, and disposed on the second gate electrode.

8. The OLED display of claim 7, wherein the light-shielding member and the second upper electrode are disposed on the same layer, and wherein the light-shielding member is spaced apart from the second upper electrode.

9. The OLED display of claim 7, wherein the light-shielding member extends from a portion of the second upper electrode.

10. The OLED display of claim 7, wherein the second active pattern comprises a second driving source region and a second driving drain region,
wherein the second driving TFT comprises a second driving source electrode electrically connected to the second driving source region and a second driving drain electrode electrically connected to the second driving drain region, and
wherein the light-shielding member, the second driving source electrode, and the second driving drain electrode are disposed on the same layer.

11. The OLED display of claim 7, wherein the third conductive layer comprises a connector that connects the second gate electrode and the second drain region, and
wherein the light-shielding member is disposed on a portion of the connector.

12. The OLED display of claim 4, wherein the third conductive layer comprises a plurality of data lines configured to respectively transfer a plurality of data signals to the first and second driving circuits.

13. The OLED display of claim 12, wherein the light-shielding member and the data lines are disposed on the same layer, and wherein the light-shielding member is spaced apart from the data lines.

14. The OLED display of claim 1, wherein the substrate further comprises a third sub-pixel region adjacent to the second sub-pixel region, and
wherein the first to third sub-pixel regions respectively correspond to a red sub-pixel region, a green sub-pixel region, and a blue sub-pixel region.

15. The OLED display of claim 1, wherein the substrate further comprises:
a third sub-pixel region adjacent to the second sub-pixel region;
a third driving circuit disposed in the third sub-pixel region on the substrate; and
a third pixel electrode electrically connected to the third driving circuit,
wherein the second pixel electrode is disposed in a first row, wherein the first and third pixel electrodes are disposed in a second row adjacent to the first row, wherein the first and second pixel electrodes are alternately disposed, and wherein the second and third pixel electrodes are alternately disposed.

16. The OLED display of claim 1, wherein each of the first source region, the first drain region, the second source region, and the second drain region is formed of Si.

17. The OLED display of claim 1, further comprising:
a first organic emission layer interposed between the first pixel electrode and the common electrode;
a second organic emission layer interposed between the second pixel electrode and the common electrode;
a first common layer interposed between the first and second pixel electrodes, and between the first and second organic emission layers; and a second common layer interposed between the first organic emission layer and the second organic emission layer, and the common electrode, wherein the first common layer comprises at least one of a hole injection layer and a hole transport layer, and wherein the second common layer comprises at least one of an electron transport layer and an electron injection layer.

18. The OLED display of claim 1, wherein the light-shielding member comprises a metallic layer.

19. The OLED display of claim 1, wherein the light-shielding member is formed of at least one of Ag, Mg, Al, Pt, Pd, Au, Ni, Nd, Ir, and Cr.

20. The OLED display of claim 17, wherein the second organic emission layer is configured to emit green light.

* * * * *